(12) United States Patent
Koc (10) Patent No.: US 12,368,394 B2
(45) Date of Patent: Jul. 22, 2025

(54) STACKED ACTUATOR COMPRISING LONGITUDINAL AND SHEAR ACTUATOR SECTIONS

(71) Applicant: PHYSIK INSTRUMENTE (PI) GMBH & CO. KG, Karlsruhe (DE)

(72) Inventor: Burhanettin Koc, Ettlingen (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 785 days.

(21) Appl. No.: 17/611,815

(22) PCT Filed: May 15, 2020

(86) PCT No.: PCT/DE2020/100426
§ 371 (c)(1),
(2) Date: Nov. 16, 2021

(87) PCT Pub. No.: WO2020/228913
PCT Pub. Date: Nov. 19, 2020

(65) Prior Publication Data
US 2022/0247329 A1 Aug. 4, 2022

(30) Foreign Application Priority Data
May 16, 2019 (DE) .................. 10 2019 112 842.0

(51) Int. Cl.
*H02N 2/02* (2006.01)
*H02N 2/06* (2006.01)
(Continued)

(52) U.S. Cl.
CPC .............. *H02N 2/021* (2013.01); *H02N 2/06* (2013.01); *H10N 30/2023* (2023.02); *H10N 30/50* (2023.02)

(58) Field of Classification Search
CPC ...... H02N 2/021; H02N 2/06; H02N 30/2023; H02N 30/50
See application file for complete search history.

(56) References Cited

U.S. PATENT DOCUMENTS

| 5,027,028 A | 6/1991 | Skipper |
| 8,269,948 B2 | 9/2012 | Bleidistel et al. |

(Continued)

FOREIGN PATENT DOCUMENTS

| DE | 102005052686 A1 | 2/2007 |
| DE | 102006048238 A1 | 5/2007 |

(Continued)

OTHER PUBLICATIONS

English Abstract for DE102005052686 retrieved on Espacenet on May 25, 2022.

(Continued)

*Primary Examiner* — Emily P Pham
(74) *Attorney, Agent, or Firm* — The Juhasz Law Firm (57) ABSTRACT

An actuator in the form of a stack is described, wherein the stack includes multiple first pairs of layers of a polarized electromechanical material and multiple second pairs of layers of a polarized electromechanical material, and the first and second pairs of layers are disposed, one behind the other, wherein at each pair of layers on each of its terminal surfaces electrically conductive layers are disposed, and, between the layers of each pair of layers, an electrically conductive layer for connection to at least one connection electrode of a second polarity is disposed, and the polarization directions of the electromechanical material of the layers of each pair are aligned opposite to one another, and the directions of polarization of the material of the layers of each pair of (Continued)

layers are aligned perpendicular to the directions of polarization of the material of the layers of each adjacent pair of layers.

17 Claims, 6 Drawing Sheets

(51) Int. Cl.
*H10N 30/20* (2023.01)
*H10N 30/50* (2023.01)

(56) References Cited

U.S. PATENT DOCUMENTS

| | | | |
|---|---|---|---|
| 10,381,955 B2 * | 8/2019 | Wischnewskiy | H02N 2/026 |
| 2002/0140783 A1 | 10/2002 | Takahashi | |
| 2003/0085633 A1 | 5/2003 | Marth | |
| 2010/0013354 A1 | 1/2010 | Marth et al. | |
| 2014/0001923 A1 | 1/2014 | Ting et al. | |

FOREIGN PATENT DOCUMENTS

| | | |
|---|---|---|
| DE | 102008012992 A1 | 9/2009 |
| EP | 1019972 B1 | 11/2006 |
| JP | 134961 A | 5/2000 |
| JP | 296485 A | 10/2000 |
| JP | 143155 A | 7/2012 |
| JP | 158242 A | 8/2013 |
| JP | 6014567 B2 | 9/2016 |
| JP | 6261565 B2 | 12/2017 |

OTHER PUBLICATIONS

English Abstract for DE102008012992 retrieved on Espacenet on May 26, 2022.
English Abstract for EP1019972 retrieved on Espacenet on May 25, 2022.
JP-Office Action of Jan. 24, 2023 (7 pages).
Japanese Patent Office Internet application software manual , 2005 (22 pages).
International Search Report and Written Opinion with regard to PCT/DE2020/100426 mailed Aug. 4, 2020.
English Abstract for DE102006048238 retrieved on Espacenet on Nov. 15, 2021.

* cited by examiner

STACKED ACTUATOR COMPRISING LONGITUDINAL AND SHEAR ACTUATOR SECTIONS

RELATED APPLICATION

This application is a National Stage Entry of PCT/DE2020/100426 filed May 15, 2020 which claims foreign priority to German application No. 10 2019 112 842.0 filed May 16, 2019; the disclosure of both which are also incorporated herein by reference for all purposes.

BACKGROUND

The invention relates to an actuator according to claims 1 to 7, a drive unit with such an actuator according to claims 8 and 9, a motor with such a drive unit according to claim 10 and a method for controlling such an actuator according to the claims 11 to 13.

US 2014/0001923 A1 discloses a piezoelectric actuator with a plurality of layers stacked on top of one another, wherein layers of piezoelectric material adjoining one another comprise directions of polarization arranged perpendicular to one another. The electrical application of the electrodes arranged on the upper and lower end faces of the stack results in a hybrid deformation of the actuator, which is composed of a longitudinal component along the stacking direction of the actuator and a shearing component transversely to the stacking direction of the actuator. In other words, by activating the, viewed in the stacking direction, two terminal electrodes deformations are simultaneously caused along the stacking direction and transversely to the same in the actuator, so that overall a superimposed deformation results. Here the layers, which are made of a piezoelectric material and whose polarization directions run along the stacking direction or parallel to the same, are responsible for the deformations along the stacking direction and thus form longitudinal actuator sections, while the layers of piezoelectric material whose polarization directions run transversely or perpendicular to the stacking direction are responsible for the deformations across the stacking direction and thus form shear actuator sections.

A disadvantage of the actuator known from US 2014/0001923 A1 is that a comparatively high control voltage is necessary in order to evoke the deformations in the longitudinal actuator sections and the shear actuator sections which are required, for the individual application case at a given height of the stack actuator. In addition, it is not possible with this actuator to generate deformations independently of one another along and transversely to the stacking direction.

The present invention is therefore based on the object to provide an actuator with which, even in the case that low electrical voltages are applied to the same, usable deformations can be generated either only along the stacking direction or only transversely to the stacking direction or else simultaneous or superimposed deformations along and transversely to the stacking direction.

SUMMARY

This object is achieved by an actuator according to claim 1, wherein the subsequent subclaims describe at least useful developments.

Therefore the basis is a stack-shaped actuator i which comprises at least a multiplicity of a first pair and a second pair of layers of polarized electromechanical material (first and second pair of layers). Optionally, there may be a plurality of a third pair of layers of electromechanical material (third pair of layers). The corresponding pairs of layers are disposed, in the stacking direction or in the longitudinal direction of the actuator, one behind the other or one above the other and in alternate sequence, wherein at each pair of layers, viewed in the stacking direction, on each of its terminal surfaces electrically conductive layers for connection to at least one connection electrode of a first polarity are disposed.

Between the layers of a pair of layers, in each case, an electrically conductive layer is disposed for connection to a connection electrode of a second polarity. The polarization directions P of the two layers of a pair of layers are oriented opposite or anti-parallel to one another, while the polarization directions P of the layers of a pair of layer are aligned in each case perpendicular to the directions of polarization of the layers of each adjacent pair of layers.

Due to the corresponding arrangement of the layers of polarized electromechanical material to one another in combination with the arrangement of the conductive layers within and between the pair of layers it is possible to control only one group of pairs of layers (this means for example only the first pairs of layers) or else at the same time two or three groups of pairs of layer, wherein already with low control voltages sufficient deformations of the actuator can be achieved.

On this basis the advantage may result that the polarization directions of the electromechanical material of the first pair of layers are aligned essentially parallel to the stacking direction of the actuator. In this case, upon application of electrical voltage to electrically conductive layers which are disposed on or in the first pair of layers, deformations along the stacking direction or along the longitudinal extension direction of the actuator can be achieved. The term 'essentially' which is used above and in the following text, shall always express that deviations of up to 10% from a specified direction or orientation (i.e. approximately parallel or perpendicular or transverse) are to be considered to fall under the invention.

In addition, it can be advantageous that the polarization directions of the electromechanical material of the second pair of layers and the optional third pair of layers are aligned essentially perpendicular to the stacking direction of the actuator, wherein the polarization directions of the electromechanical material of the second pair of layers differ from those of the electromechanical material of the optional third pair of layers and are disposed essentially perpendicular to one another. In this way, by applying an electrical voltage to the electrically conductive layers which are arranged on or in the second pair of layers, deformations can be achieved transversely to the stacking direction or transversely to the longitudinal extension direction of the actuator, wherein in case of existence of an additional optional third pair of layers transverse deformations in two different directions and preferably directions which are aligned perpendicular to one another are possible.

It can also be advantageous that all electrically conductive layers which are provided for connection to a connection electrode of a first polarity extend to one and the same side surface of the stack, and all electrically conductive layers which are provided for connection to a connection electrode of a second polarity extend to another and the same side surface of the stack. This enables a comparatively simple electrical connection of all electrically conductive layers to the respective connection electrodes.

Due to the alternating order of the different pairs of layers in the stacking direction (including, but not limited to, the following sequences or orders: first pair of layers/second pair of layers/first pair of layers/second pair of layers etc.; first pair of layers/second pair of layers/third pair of layers/ first pair of layers/second pair of layers/third pair of layers etc.; first pair of layers/second pair of layers/first pair of layers/third pair of layers etc.), especially in case that only one group of pair of layers is controlled, the heat generated therein can be effectively transferred to the adjacent and non-controlled pair of layers, so that the thermal load of the actuator can be kept low, especially at high frequencies or in case of application of higher electrical voltages. The alternating order of the pairs of layers also has advantages in case of simultaneous control of all groups of pairs of layers, since the deformation directions of adjacent pairs of layers are respectively arranged perpendicular to one another, so that the local stresses at the interfaces between two adjacent pairs of layers are reduced.

It can also be advantageous that the first pairs of layers are designed to carry out deformations along the stacking direction in case that an electrical voltage signal is applied to the associated electrically conductive layers and to form longitudinal actuator sections of the actuator, and that the second and the optional third pair of layers are designed to carry out deformations transversely to the stacking direction in case that an electrical voltage signal is applied to the associated electrically conductive layers and to form shear actuator sections in each case. Thereby movements of the actuator in two or three different directions and directions which are perpendicular to each other are possible independently from each other, wherein also, in case of parallel or simultaneous electrical control of the different pairs of layers, correspondingly superimposed deformations are possible.

The invention also relates to a drive unit with at least one actuator described above, wherein the actuator is connected via one of the terminal surfaces, viewed in the stacking direction, with an end portion of an elongated and elastically deformable support element is connected and wherein a friction element on the opposite end face with respect to its stacking direction is arranged. Such a drive unit is comparatively simple and inexpensive to manufacture, and with the same the friction element can be pressed flexibly against an element to be driven with sufficient force in a relatively simple manner.

It can be advantageous here that the friction element comprises two spaced-apart projecting portions which are provided for frictional contact with an element to be driven. Due to a friction element designed in this way, a greater driving force can be transmitted to an element to be driven. In addition, the space between the two protruding sections creates a reservoir for abrasion which occurs during operation of the actuator unit. In addition, however, it is also conceivable that the friction element comprises only one protruding section, or more than two protruding and spaced apart sections.

The invention also relates to a motor with at least one drive unit described above, comprising an actuator according to the invention and an element to be driven by the drive unit, wherein the drive unit is connected to a base of the motor via an end section of the support element, so that the friction element is resiliently pressed against the element to be driven.

The invention also relates to a method for operating an actuator described above, in which either only the longitudinal actuator sections or only the shear actuator sections are controlled by an electrical voltage signal. As a result, the actuator can carry out either a single longitudinal deformation along its stacking direction or a single shear deformation in a direction transverse to its stacking direction or sole shear deformations in two different directions transverse to its stacking direction.

As an alternative to the control method mentioned above, it can be advantageous that an electrical voltage signal can in each case applied to some or all of the longitudinal actuator sections and some or all of the shear actuator sections are each acted upon with, so that superimposed longitudinal and transverse deformations of the actuator result. It be advantageous in this regard that the corresponding electrical voltage signal comprises a sawtooth shape, for example in order to realize an inertia or stick-slip drive, or that the corresponding electrical voltage signal is sinusoidal in order to realize a quasi-continuous drive.

Finally, the invention relates to a computer program product which is designed to create a digital image (digital twin) of the actuator described above or of the above drive unit or of the above motor.

DESCRIPTION OF THE DRAWINGS

Advantages and expediencies of the invention will become clearer from the following description of preferred exemplary embodiments with reference to the figures, wherein the same reference numerals refer to the same parts of the different figures, which show.

DETAILED DESCRIPTION

Figure 1A:
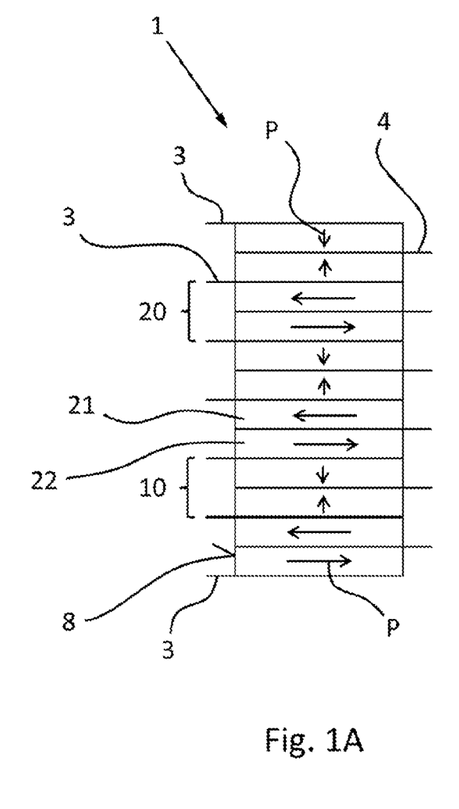
FIG. 1A: an actuator according to the invention in a side view.
Figure 1B:
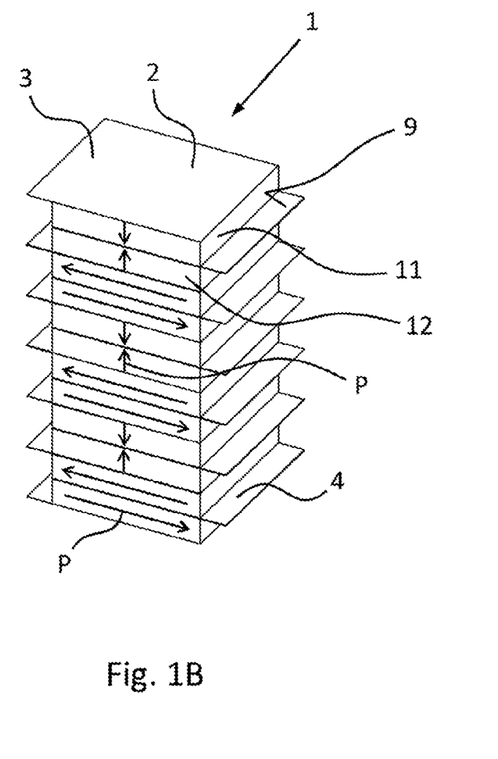
FIG. 1B: the actuator according to FIG. 1A in a perspective view

FIG. 1A shows a side view of an embodiment of an actuator 1 according to the invention in the form of a stack 2 comprising a plurality of layers 11, 12, 21, 22 of polarized piezoceramic material which are stacked one on top of the other; FIG. 1B shows a corresponding perspective view of this actuator. Two adjacent layers 11 and 12 or 21 and 22, which fit against each other, form a pair of layers 10 and 20, respectively, wherein electrically conductive layers 3 are arranged on each pair of layers 10 and 20 on its two end faces viewed in the stacking direction, wherein the electrically conductive layers 3 are provided for an electrical connection to a connection electrode of a first polarity which is not shown in FIG. 1, and wherein between the two adjoining layers of a pair of layers an electrically conductive layer 4 is arranged, which is provided for an electrical connection to a connection electrode of a second polarity which is also not shown in FIG. 1.

All electrically conductive layers 3, which are provided for connection to a connection electrode of a first polarity, extend on one side up to the side surface 9 of the stack 2 of the actuator 1 and protrude beyond the opposite side surface 8, so that there is a particularly simple possibility for electrical connection to the connection electrode of the first polarity. In an analogous manner, all electrically conductive layers 4, which are provided for connection to a connection electrode of a second polarity, extend up to the side surface 8 and at the same time protrude over the opposite side surface 9 out, so that there is an equally simple possibility for electrical connection to the connection electrode of the second polarity. In addition to the above-described arrangement of the electrically conductive layers 3 and 4, it is also conceivable to provide a so-called interdigital arrangement for these, so that the respective electrical layers only extend to one of the side surfaces 8 and 9 and are spaced from the correspondingly opposite side surface for reasons of electrical insulation.

It is conceivable to arrange an electrically insulating layer or a separating layer between the electrically conductive layers 3 of adjacent pairs of layers in each case, so that adjacent pairs of layers do not directly adjoin one another. In addition, it is conceivable that the electrically conductive layers 3 of adjoining or neighboring pairs of layers are realized in one piece or integrally with one another, so that the neighboring pairs of layers share the respective conductive layer 3 with one another.

The polarization directions P of the electromechanical material of the two layers of a pair of layers, i.e. on the one hand the layers 11 and 12 of the pair of layers 10 and on the other hand the layers 21 and 22 of the pair of layers 20, are respectively aligned opposite and anti-parallel to one another, while the polarization directions of the electromechanical material of the layers of a pair of layers respectively are aligned perpendicular to the polarization directions of the electromechanical material of the layers of each adjacent or adjoining pair of layers. In other words: the polarization directions of adjoining or adjacent pairs of layers are respectively aligned perpendicular to one another.

In this regard, the polarization directions P of the pairs of layers 10 are disposed in or parallel to the stacking direction of the actuator 1, while the polarization directions P of the pairs of layers 20 are arranged perpendicular or transversely to the stacking direction of the actuator. By applying an electrical voltage to the electrical layers 3 and 4 assigned to the pair of layers 10, a deformation can be caused in each of these pairs of layers mainly in or along the stacking direction of the actuator, so that these pairs of layers form longitudinal actuator sections. On the other hand through applying an electrical voltage to the electrical layers 3 and 4 assigned to the pairs of layers 20 in each case a deformation mainly transversely to the stacking direction of the actuator can be caused, so that these pairs of layers form shear actuator sections. It is possible to electrically control only the longitudinal actuator sections or only part of the longitudinal actuator sections electrically, or to electrically control only the shear actuator sections or only a part of the shear actuator sections. In addition, a common or simultaneous control of longitudinal actuator sections and shear actuator sections can be realized.

Figure 2:
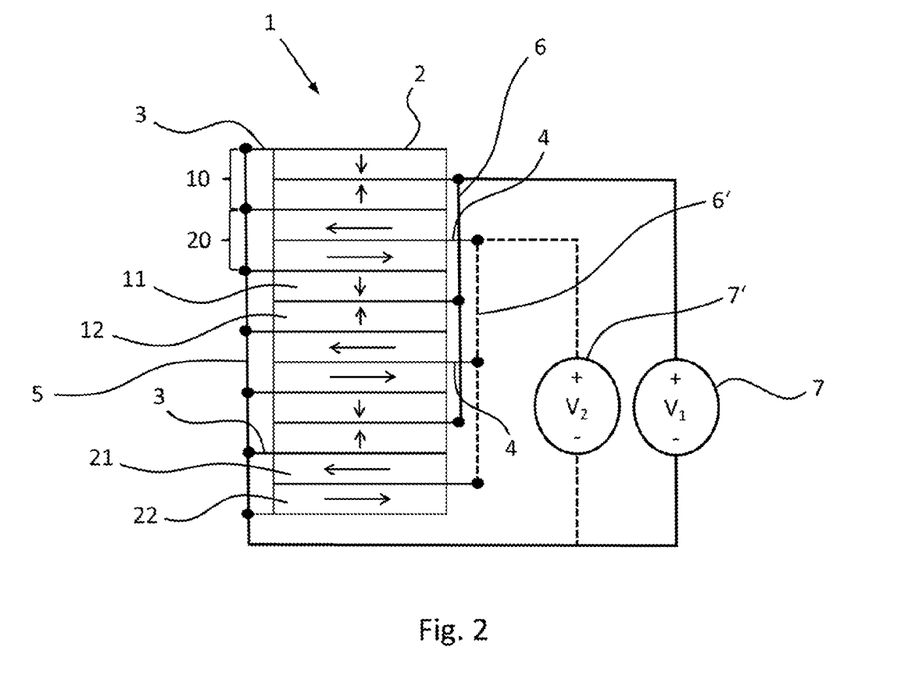
FIG. 2: a block diagram relating to a possible electrical control for the actuator according to FIG. 1

In FIG. 2 is a block diagram relating to a possible electrical control for the actuator according to FIG. 1 is shown. All electrically conductive layers 3 are connected to a connection electrode 5 of a first polarity, wherein the connection electrode 5 is connected to the corresponding pole of a first voltage source 7. The other pole of the first voltage source 7 is connected to a connection electrode 6, which for its part is in electrical contact with all electrically conductive layers 4 of the pairs of layers 10, that is to say the pairs of layers in which the polarization directions of the electromechanical material of the respective layers 11 and 12 are aligned in or along the stacking direction of the actuator and which form longitudinal actuator sections.

The block diagram of FIG. 2 also shows a second voltage source 7', the first pole of which is also connected to the connection electrode 5 and the second pole of which is connected to the connection electrode 6', wherein the connection electrode 6' is in contact with all electrically conductive layers 4 of the pairs of layers 11, that is to say the pairs of layers which have polarization directions of the electromechanical material of the respective layers 21 and 22 are aligned transversely or perpendicular to the stacking direction of the actuator and form shear actuator sections.

Thus, according to the block diagram of FIG. 2, either only the longitudinal actuator sections or only the shear actuator sections or the longitudinal actuator sections and the shear actuator sections are controlled jointly for a respectively desired deformation of the actuator, as shown in the simulations realized by FEM calculations according to FIGS. 3A to 3D.

Figures 3A, 3B:
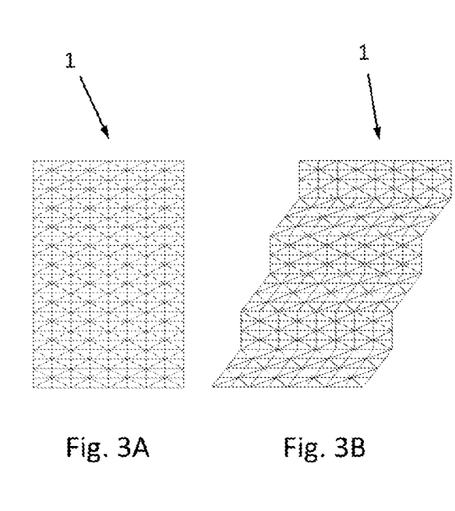
FIG. 3A to 3D: deformation states of the actuator according to FIG. 1 or FIG. 2 which are simulated by FEM calculations due to different electrical control of the longitudinal actuator sections and the shear actuator sections
Figure 3C:
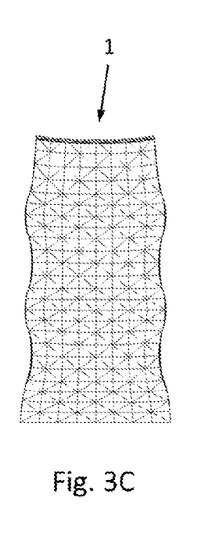
Figure 3D:
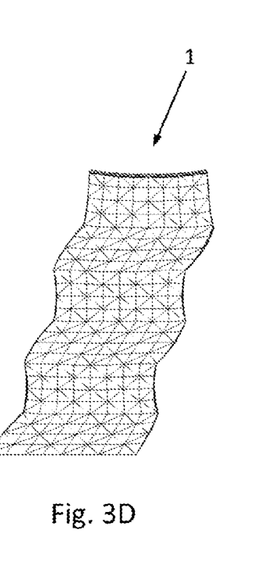

Here, FIG. 3A shows the underlying FEM model for the actuator according to FIGS. 1 and 2 in its initial state, i.e. in an electrically not controlled state, while FIG. 3B shows the calculated deformation in case of sole control of the shear actuator sections of this actuator. FIG. 3C shows the calculated deformation in case of sole control of the longitudinal actuator sections, and FIG. 3D finally represents the calculated deformation with simultaneous control of the longitudinal actuator sections and the shear actuator sections of this actuator.

Figure 4:
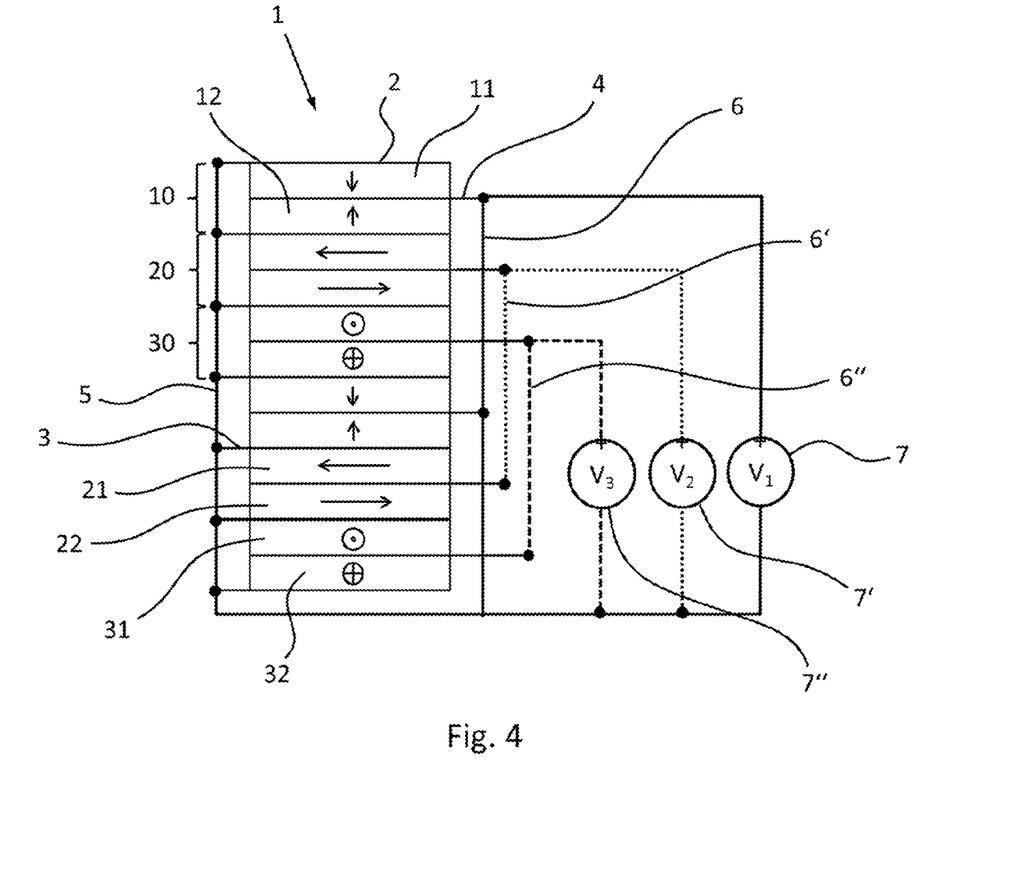
FIG. 4: a block diagram relating to a possible electrical control of an actuator according to the invention with three groups of pairs of layers

The block diagram of FIG. 4 differs from that block diagram according to FIG. 2 only in that the actuator on which the block diagram according to FIG. 4 is based comprises additional pairs of layers 30, which, as the pairs of layers 20, form shear actuator sections, wherein, in contrast, the directions of polarization of the piezoelectric material of layers 31 and 32 have an alignment which is both perpendicular to the directions of polarization of the piezoelectric material of layers 11 and 12 and perpendicular to the directions of polarization of the piezoelectric material of layers 21 and 22. Correspondingly, the block diagram according to FIG. 4 also shows different or extended type of control due to the different structure of the actuator, wherein an additional third voltage source 7" is connected with one pole to the connection electrode 5 and with the other pole to the connection electrode 6", and wherein the connection electrode 6" itself is connected to all electrically conductive layers 4 of the pair of layers 30, so that a separate control also of the additional shear actuator sections is enabled. In analogy to the control option of the actuator according to FIG. 2, it can be realized to control either only the longitudinal actuator sections of the pairs of layers 10, or only the shear actuator sections of the pairs of layers 20, or only the shear actuator sections of the pairs of layers 30, wherein it shall be understood that all possible combined control variants can also be realized.

Figure 5:
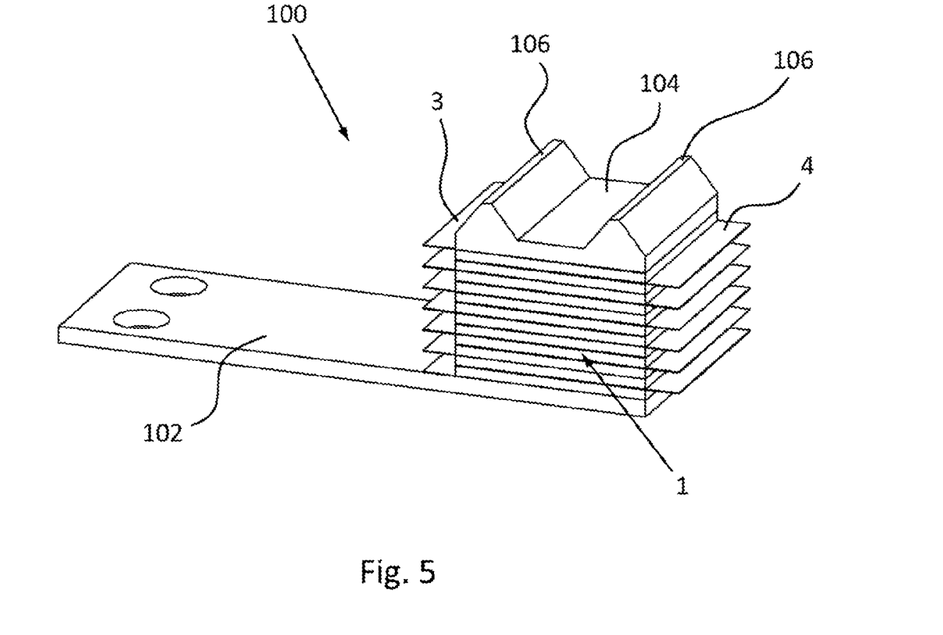
FIG. 5: drive unit with an actuator according to the invention

FIG. 5 shows an embodiment of a drive unit 100 with an actuator 1 according to the invention according to FIG. 1. The actuator 1 is connected to an end section of an elongated, flat and elastically deformable support element 102 made of steel via a flat terminal surface with respect to its stacking direction. The support element can also consist of other metals, such as titanium or phosphor bronze. It is also conceivable to use a support element made of a plastic filled with fibers.

On the corresponding opposite terminal surface of the actuator a friction element 104 is arranged, which comprises two projection portions 106 which are spaced apart and are disposed parallel to one another and which are provided for frictional contact with an element to be driven.

Figure 6:
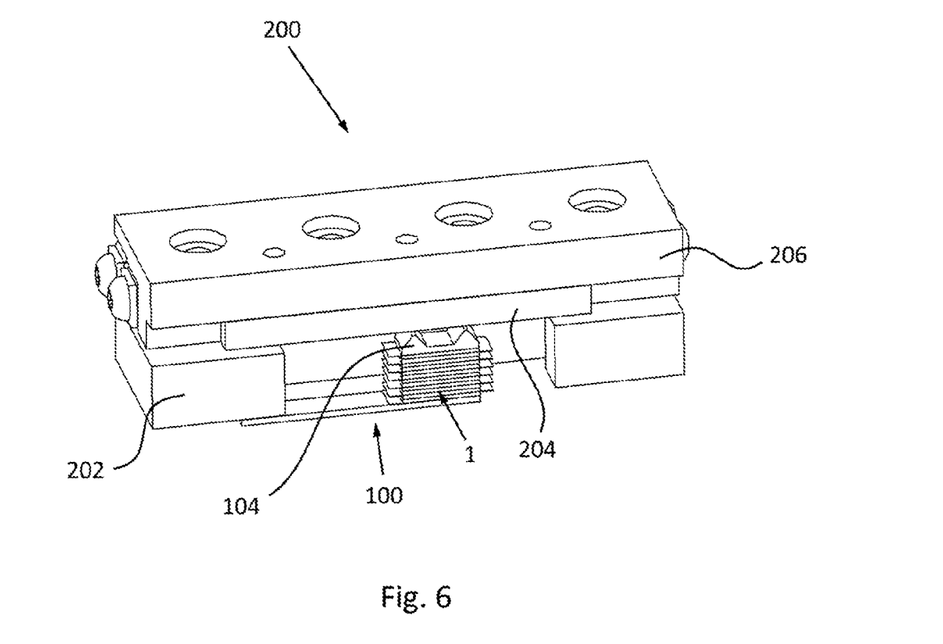
FIG. 6: motor with a drive unit according to FIG. 5

Referring to FIG. 6, an embodiment of a motor 200 with a drive unit is shown in FIG. 5. Here, the support element is connected to a base element 202 via an end section. On the base element 202 an element 206 to be driven which is linearly movable or displaceable is disposed on which a friction or friction rail 204 is attached, with which the friction element 104 is in frictional contact.

Figure 7A:
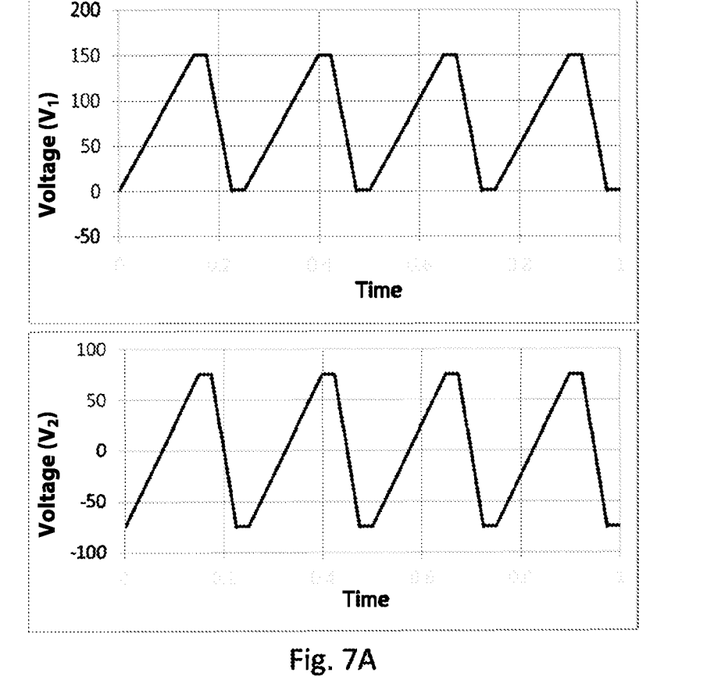
FIGS. 7A to 7C: control voltages and deformations of a correspondingly controlled drive unit with an actuator according to the invention as shown in FIG. 5, wherein the deformations are simulated per FEM calculations
Figure 7B:
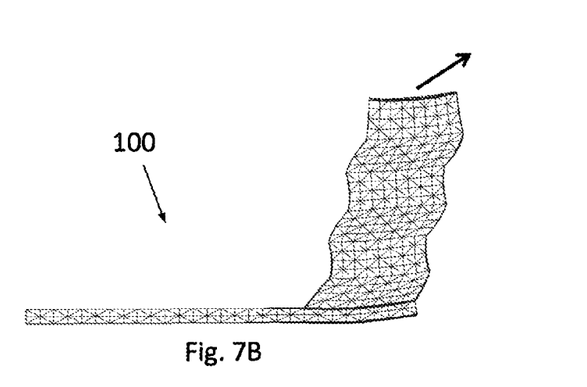
Figure 7C:
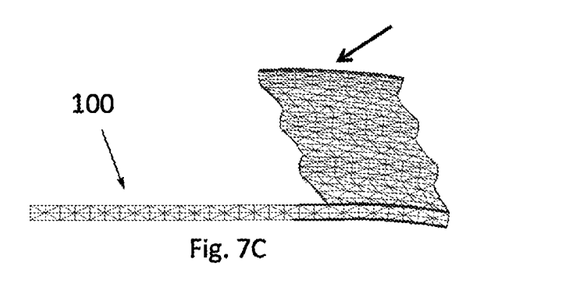

FIGS. 7A to 7C and 8A to 8C show control voltages and deformations, simulated by FEM calculations, of a correspondingly controlled drive unit according to FIG. 5 using the circuit shown in FIG. 2. The sawtooth-shaped voltage of the voltage source 7 shown in the upper illustration of FIG. 7A is applied to the longitudinal actuator sections, while the sawtooth-shaped voltage of the voltage source 7' shown in the lower illustration of FIG. 7A is applied to the shear actuator sections. The electrical voltages of the two voltage sources 7 and 7' are therefore applied simultaneously to the actuator or the corresponding actuator sections and cause deformations by superposition, the two maximum states of which are shown in FIGS. 7B and 7C.

Accordingly, the actuator deforms once at the same time with its corresponding longitudinal expansion to the right (FIG. 7B), and, in the related backward movement, which is accompanied by a contraction of the actuator in its stacking direction, to the left in a superimposed manner (FIG. 7C). In other words, the actuator expands with a simultaneous shearing to the right (FIG. 7B), and at the same time contracts with a simultaneous shearing to the left (FIG. 7C). This periodically repeating deformation leads to a movement of the actuator which can be used to drive an element to be driven. With the simultaneous linear expansion and shearing to the right according to FIG. 7B, an element to be driven element, which is disposed opposite to the actuator, can be carried along to the right, after it came into contact with the actuator due to the linear expansion. On the other hand, the contact between the element to be driven and the actuator during its longitudinal contraction and simultaneous shear to the left according to FIG. 7C can be canceled out, so that the shear of the actuator in the direction which is directed opposite to the drive direction is not transmitted to the drive direction and thereby the backward movement of the actuator does not have an impact on the element to be driven.

Figure 8A:
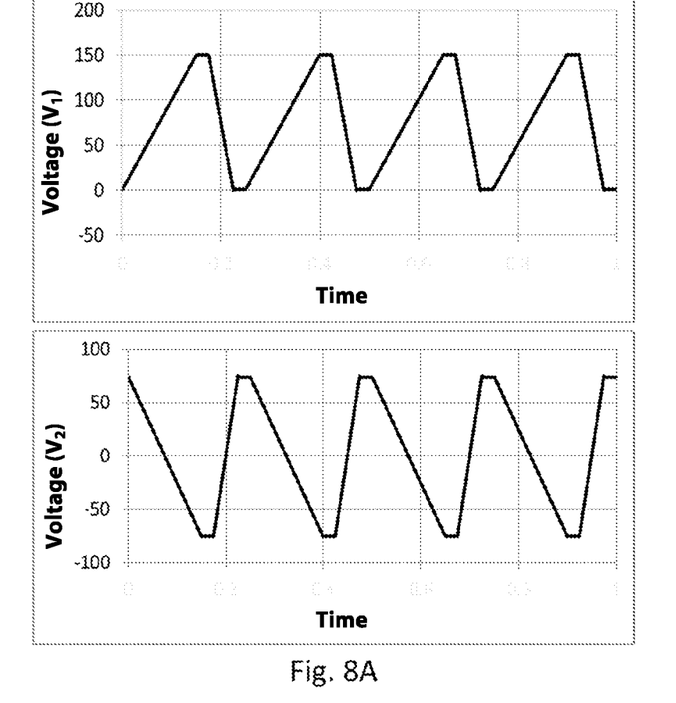
FIGS. 8A to 8C: control voltages and deformations of a correspondingly controlled drive unit with an actuator according to the invention according to FIG. 5, wherein the deformations are simulated per FEM calculations
Figure 8B:
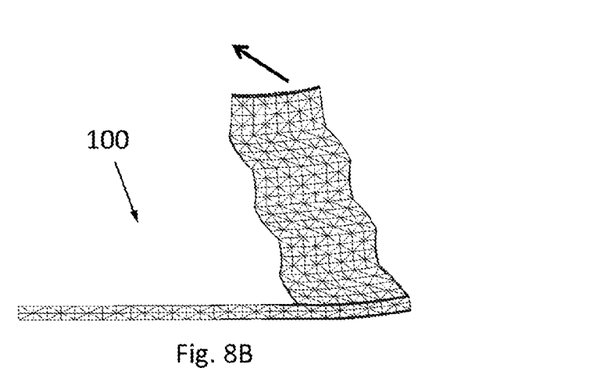
Figure 8C:
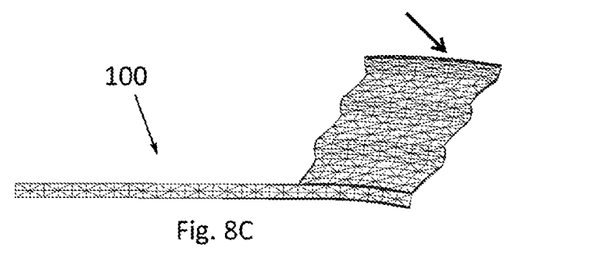

FIGS. 8A to 8C illustrate the voltage signals which are applied to the longitudinal actuator sections and shear actuator sections and the corresponding maximum deformations of the actuator according to the invention for realizing a drive movement which is directed opposite with respect to FIG. 7, i.e. a movement of an element to be driven, which is arranged opposite to the actuator, to the left. The voltage signals which are applied to longitudinal actuator sections according to the upper illustration of FIG. 8A are identical to the voltage signals in the upper illustration of FIG. 7A. In contrast thereto, the voltage signals which are applied to the shear actuator sections differ according to the lower illustration of FIG. 8A of those in the lower illustration of FIG. 7A in that a steeper rising flank is followed by a flatter falling flank. This causes a slower shear deformation in the shear actuator sections in the drive direction (according to FIG. 8B) and a faster shear deformation opposite to the drive direction (according to FIG. 8C).

Regarding the voltage signals according to FIG. 7A and FIG. 8A, respectively, always the flatter and steeper flanks of the two associated sawtooth voltages V1 and V2 temporally coincide, which means that temporally jointly or simultaneously a slower expansion or shear takes place in a direction that corresponds to the drive direction of an element to be driven (drive phase) and temporally jointly or simultaneously a faster contraction or shear takes place in a direction that is opposite to the drive direction of an element to be driven (retraction phase). During the drive phase, the actuator or the friction element, which is disposed on the same, due to the expansion of the longitudinal actuator sections comes in contact with the element to be driven, whereby the shear movement which takes place simultaneously can be transferred in drive direction to the element to be driven. The withdrawal phase should take place as fast as possible in order to be able to start the following drive phase. Therefore, based on the corresponding voltage signals, a rapid contraction of the longitudinal actuator sections and an equally rapid shear deformation opposite to the drive direction takes place here.

LIST OF REFERENCE SYMBOLS 1 actuator
2 stack
3 electrically conductive layer (of actuator 1)
4 electrically conductive layer (of actuator 1)
5 connection electrode (first polarity)
6, 6', 6" connection electrode (second polarity)
7, 7', 7" voltage source
8 side surface (of actuator 1)
9 side surface (of actuator 1)
10 pair of layers
11, 12 layers (of pair of layers 10)
20 pair of layers
21, 22 layers (of the pair of layers 20)
30 pair of layers
31, 32 layers (of the pair of layers 30)
100 drive unit
102 carrier element (of the drive unit 100)
104 friction element (of the drive unit 100)
106 protruding portions (of the friction member 104)
200 motor
202 base element (of motor 200)
204 friction rail (of motor 200)
206 element to be driven (of motor 200)
P direction of polarization (of the electromechanical material of the layers 11, 12, 21, 22, 31, 32)

The invention claimed is:

1. An actuator in the form of a stack, wherein the stack comprises at least a plurality of a first pair of layers with two layers of a polarized electromechanical material and a plurality of a second pair of layers with two layers of a polarized electromechanical material, and the first and second pairs of layers are disposed, in the stacking direction, one behind the other and in alternate sequence, wherein at each pair of layers, viewed in the stacking direction, on each of its terminal surfaces electrically conductive layers for connection to at least one connection electrode of a first polarity and, in each case between the two layers of each pair of layers, an electrically conductive layer for connection to at least one connection electrode of a second polarity are disposed, and the polarization directions of the electromechanical material of the two layers of each pair of layers are aligned opposite to one another, and the directions of polarization of the electromechanical material of the layers of each pair of layers are aligned in each case perpendicular to the directions of polarization of the electromechanical material of the layers of each adjacent pair of layers, and wherein the directions of polarization of the electromechanical material of the layers of each first pair of layers are aligned essentially parallel to the stacking direction of the actuator.

2. The actuator according to claim 1, wherein the polarization directions of the electromechanical material of the layers of each second pair of layers are aligned essentially perpendicular to the stacking direction of the actuator.

3. The actuator according to claim 2, wherein the stack comprises a plurality of a third pair of layers with two layers of a polarized electromechanical material, wherein at each third pair of layers, viewed in the stacking direction, on each of its terminal surfaces electrically conductive layers for connection to at least one connection electrode of a first polarity and in each case between the two layers of each pair of layers an electrically conductive layer for connection to at least one connection electrode of a second polarity are disposed, and the polarization directions of the electromechanical material of the two layers of each third pair of layers are aligned opposite to one another, and the polarization directions of the electromechanical material of the layers of each third pair of layers are aligned essentially perpendicular to the stack direction of the actuator and essentially perpendicular to the polarization directions of the electromechanical material of the layers of each first pair of layers and essentially perpendicular to the polarization directions of the electromechanical material of the layers of each second pair of layers.

4. The actuator according to claim 3, wherein the three pairs of layers are disposed in alternate sequence one behind the other in the stacking direction.

5. The actuator according to claim 1, wherein the first pairs of layers configured to, in case of application of an electrical voltage signal to the associated electrical conductive layers carry out deformations along the stack direction, and form longitudinal actuator sections of the actuator, and that the second pairs of layers and optionally a third pairs of layers are configured to, in case of application of an electrical voltage signal to the associated electrical conductive layers, carry out deformations transversely to the stack direction, and respectively form the shear actuator sections of the actuator.

6. The actuator according to claim 1, wherein the conductive layers of adjacent pairs of layers are formed in one piece with one another.

7. A method for operating the actuator according to claim 5, wherein either only the longitudinal actuator sections or only the shear actuator sections are acted upon with an electrical voltage signal, or at the same time the longitudinal actuator sections and the shear actuator sections are each acted upon with an electrical voltage signal.

8. The method according to claim 7, wherein the electrical voltage signal has a sawtooth shape.

9. The method according to claim 7, wherein the respective electrical voltage signal is sinusoidal.

10. A computer program product that is configured to provide a digital image of the actuator according to claim 1.

11. An actuator according to claim 1 in combination with an elongated and elastically deformable surface support element and a friction element, wherein the actuator is connected at one end to an end section of the elongated and elastically deformable surface support element and is connected at another end to a friction element.

12. The drive unit according to claim 11, wherein the friction element comprises two protrusion sections which are spaced apart from one another and are arranged parallel to one another, wherein the protrusion sections are provided for frictional contact with an element to be driven.

13. A drive unit comprising:
an actuator in the form of a stack, wherein the stack comprises at least a plurality of a first pair of layers with two layers of a polarized electromechanical material and a plurality of a second pair of layers with two layers of a polarized electromechanical material, and the first and second pairs of layers are disposed, in the stacking direction, one behind the other and in alternate sequence, wherein at each pair of layers, viewed in the stacking direction, on each of its terminal surfaces electrically conductive layers for connection to at least one connection electrode of a first polarity and, in each case between the two layers of each pair of layers, an electrically conductive layer for connection to at least one connection electrode of a second polarity are disposed, and the polarization directions of the electromechanical material of the two layers of each pair of layers are aligned opposite to one another, and the directions of polarization of the electromechanical material of the layers of each pair of layers are aligned in each case perpendicular to the directions of polarization of the electromechanical material of the layers of each adjacent pair of layers;
wherein the actuator is connected via a first terminal surface of a terminal surface, which is disposed with respect to its stacking direction, to a first end section of an elongated and elastically deformable surface support element, and on an opposite second terminal surface of the terminal surfaces with respect to its stacking direction a friction element is arranged.

14. The drive unit according to claim 13, wherein the friction element has two protrusion sections that are spaced apart from one another and are arranged parallel to one another, wherein the protrusion sections are provided for frictional contact with an element to be driven.

15. A motor comprising at least one of the drive unit according to claim 13 and an element to be driven, wherein the drive unit is connected to a base of the motor via an end section of the support element, so that the friction element is resiliently pressed against the element to be driven.

16. A computer program product that is configured to provide a digital image of the drive unit according to claim 13.

17. A computer program product that is configured to provide a digital image of the motor according to claim 15.

* * * * *